United States Patent [19]
Cornish

[11] Patent Number: 4,609,893
[45] Date of Patent: Sep. 2, 1986

[54] NON-RESONANT MICROWAVE FREQUENCY HALVER

[75] Inventor: William D. Cornish, Nepean, Canada

[73] Assignee: Canadian Department of National Defence, Ottawa, Canada

[21] Appl. No.: 666,899

[22] Filed: Oct. 31, 1984

[30] Foreign Application Priority Data

Feb. 29, 1984 [CA] Canada ................................... 448510

[51] Int. Cl.$^4$ .......................... H01P 1/20; H03B 19/05
[52] U.S. Cl. .................................. 333/218; 333/128; 333/246
[58] Field of Search ................. 333/117, 121, 26, 218; 363/158; 455/327

[56] References Cited

U.S. PATENT DOCUMENTS

| | | | |
|---|---|---|---|
| 3,946,339 | 3/1976 | Oltman, Jr. et al. | 333/121 |
| 4,152,680 | 5/1979 | Harrison | 333/218 |
| 4,266,208 | 5/1981 | Cornish | 333/218 |

Primary Examiner—Paul Gensler
Attorney, Agent, or Firm—Larson and Taylor

[57] ABSTRACT

A broadband non-resonant microwave frequency halver which simultaneously decouples the input frequency from the output port through phase cancellation and couples the subharmonic frequency to the output port through phase addition providing good isolation between input and output over a very broad frequency range. The implementation of this circuit specifically excludes resonant, or frequency dependent elements and therefore has a much broader band of operation than previous circuits which relied on resonant phenomena.

7 Claims, 12 Drawing Figures

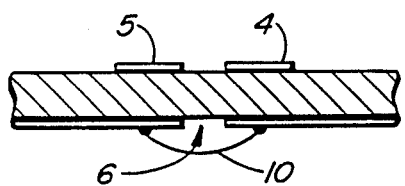
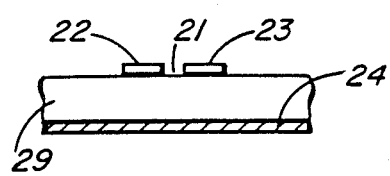
FIG. 3b          FIG. 4a
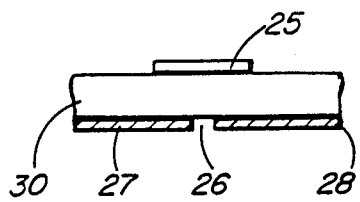
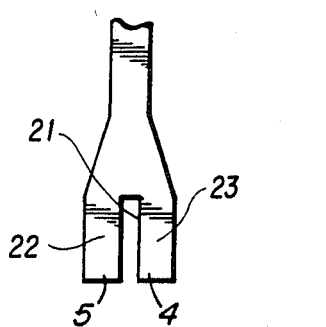
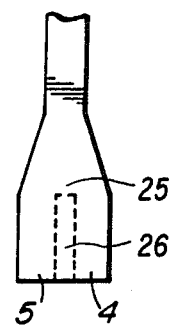
FIG. 4b          FIG. 4c      FIG. 4d
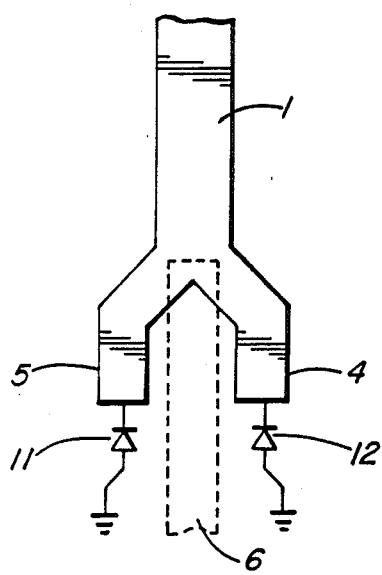
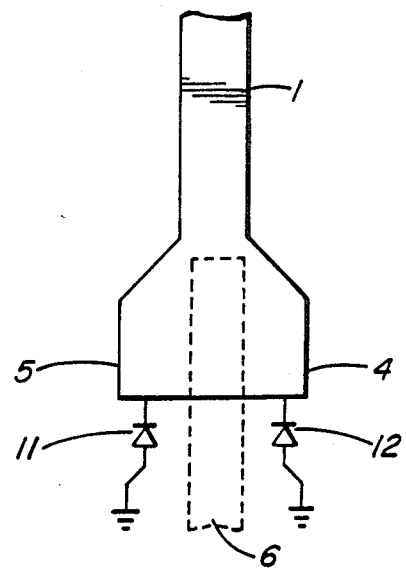
FIG. 5a          FIG. 5b

NON-RESONANT MICROWAVE FREQUENCY HALVER

This invention relates to broadband microwave frequency dividers.

Such frequency dividers are described in applicant's Canadian Pat. No. 1,041,614, issued Oct. 31, 1978, naming Robert C. Harrison as inventor and corresponds to U.S. Pat. No. 4,152,680, issued May 1, 1979; and U.S. Pat. No. 1,121,006, issued Mar. 30, 1982, naming William D. Cornish and Francois A. Gauthier as inventors and corresponding to U.S. Pat. No. 4,334,202, issued June 8, 1982. In U.S. Pat. No. 1,041,614, a frequency divider is described using varactor diodes. U.S. Pat. No. 1,121,006 describes improvements in the manner of bias voltage supply to such frequency dividers. Canadian patent application 403,007 naming William D. Cornish and Lawrence B. Hewitt as inventors and correspondig to U.S. Pat. No. 4,533,886, issued Aug. 6, 1985, describes a divider which does not require injection of a dc bias voltage.

Some of these circuits require a dc bias voltage to drive the varactor diodes into forward bias, while others do not. In all cases, however, these devices were limited to an octave band of operation or less. For example, a given unit would have an input of 2-4 GHz, while another would work from 4-8 GHz and yet another from 8-16 GHz. In all cases the insertion loss, or conversion loss in dividing the frequency by two is of the order of 15 to 20 dB.

It is therefore the object of the present invention to provide an improved frequency halver which, typically, has a lower insertion loss. For example, one of the frequency halvers had an insertion loss of 10 dB with certain parts of the band having an insertion loss as low as approximately 6 dB. This is a 20 fold improvement over previous devices. These frequency halvers can be used with a reverse dc bias, zero dc bias, or a forward dc bias on the varactor diodes.

It is a further object of this invention to provide frequency halvers that work over a much broader bandwidth than one octave. For example, one of the new frequency halvers has worked over the entire band from 4.8 GHz to 14 GHz.

It is a further object of this invention to provide improved isolation of the input frequency from the output port of the halver.

Accordingly there is provided a broadband microwave divider comprising a microstrip to slotline transition wherein the transition consists of at least one microstrip line on one side of a dielectric substrate having at least two microstrip ports and at least one slotline on the opposite side of the dielectric substrate having at least one slotline port, each microstrip port being connected to at least one varactor diode such that a signal of frequency f at the microstrip line will result in a signal with a frequency f/2 at the slotline to provide a frequency halver operating over a very wide broad bandwidth.

Particular embodiments of the invention will be described in conjunction with the accompanying drawings in which:

FIG. 1 is a simplified diagram of a microstrip to slotline transition described in the prior art;

FIGS. 2(a) and 2(b) are schematic representations of the frequency divider according to this invention;

FIGS. 3(a) and 3(b) are schematic representations of the frequency divider of FIGS. 2(a) and 2(b) when the shorted ports are long;

FIG. 4(a) is a schematic elevation of another embodiment of frequency divider;

FIG. 4(b) is a schematic elevation of a further embodiment of frequency divider;

(FIG. 4(c) is a plan view of FIG. 4(a);

FIG. 4(d) is a plan view of FIG. 4(b);

Figure 6:
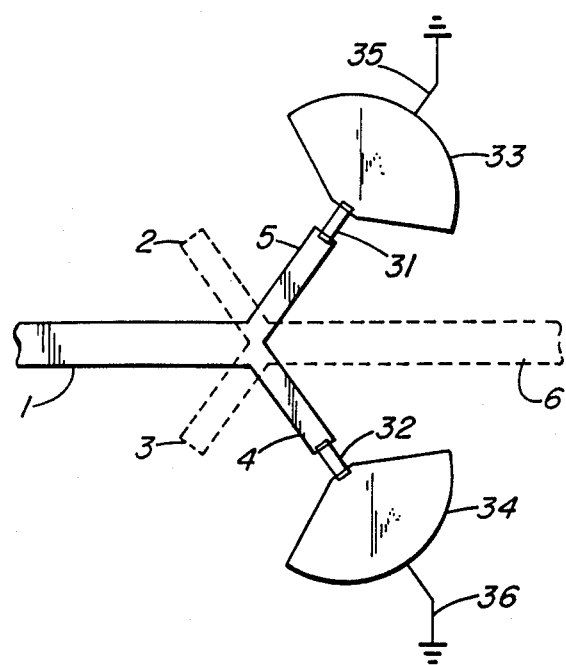

FIGS. 5(a) and 5(b) are diagrams showing other embodiments according to the present invention; and FIG. 6 is an alternative configuration according to the present invention.

Figure 1:
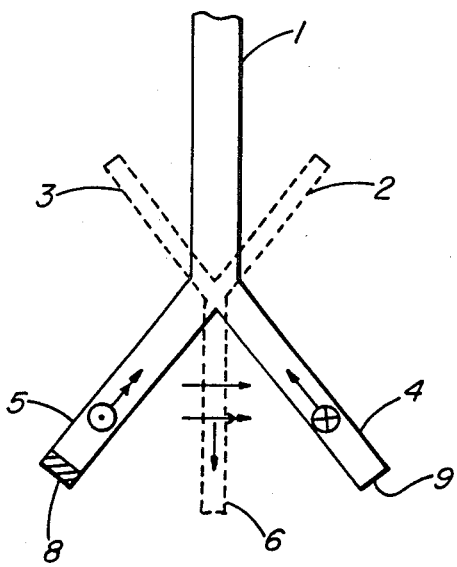

FIG. 1 is a diagram showing a microstrip to slotline transition as discussed in a paper of the IEEE Transactions on Microwave Theory and Techniques, Vol. MTT-24, April 1976, Pages 231-233. The solid lines represent microstrip on one side of a dielectric substrate and the dashed lines represent slotline on the opposite side of the substrate.

In order for a signal to pass from port (1) to port (6) there must be a phase imbalance (ideally a phase reversal) between the reflected signals at ports (4) and (5) or between ports (2) and (3), and ideally at both. That prior design circumvented this problem by causing a 180° phase shift between the reflections from ports (4) and (5) by simply short circuiting port (5) and open circuiting port (4) as shown at (8) and (9) respectively.

Figure 2A:
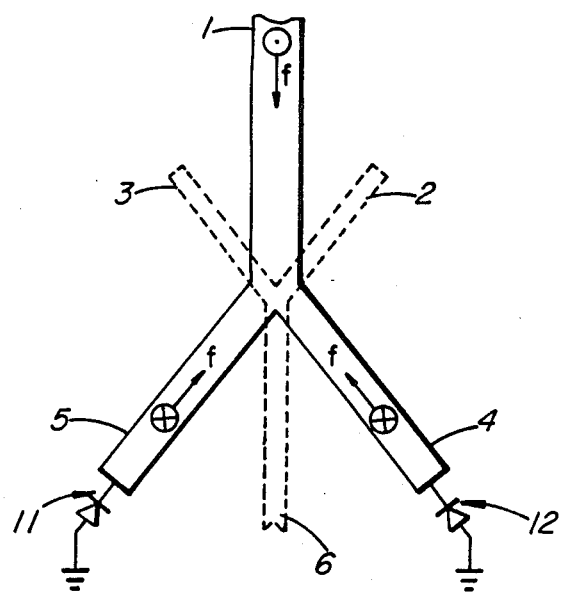
Figure 2B:
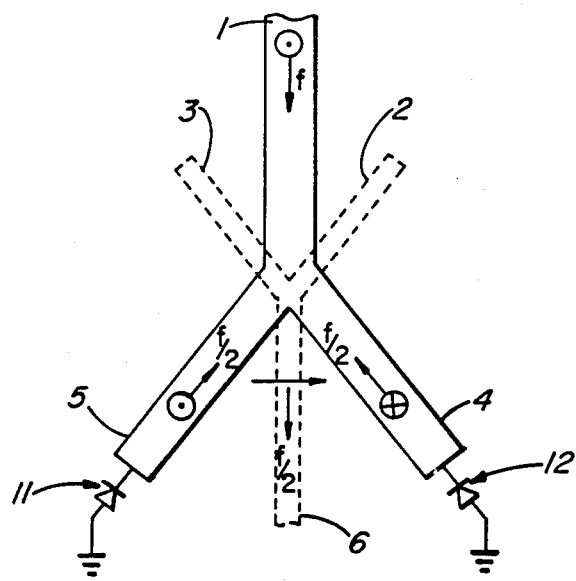

The key to the operation of applicant's frequency halver is that the required phase reversal can be accomplished in conjunction with the subharmonic generation process. As shown in FIG. 2(a) and (b) two varactor diodes (11) and (12) are connected from microstrip ports (5) and (4) to ground. The slotlines (2) and (3) are shorted. In the configuration of FIG. 2, the anodes are grounded. The diode polarity can be reversed, i.e. cathodes grounded, however, both diodes should always have the same polarity. When two varactors are fed in phase at an input frequency f, they will, under the proper conditions, produce a subharmonic oscillation of f/2 and the currents in the diodes at f2 will be out of phase. In this case, then, by using this property the waves reflected from ports (4) and (5) at the input frequency f will be in phase as shown in FIG. 2(a), and the waves reflected from (4) and (5) at f/2 will be out of phase as shown in FIG. 2(b).

The overall result of this is that an input of frequency f at port (1) causes an output of f/2 at port (6) with ports (1) and (6) being (theoretically) completely decoupled at the input frequency. Since the coupling of f/2 into port (6) is independent of frequency, this geometry will provide a frequency halver that will work over a very broad bandwidth.

Varying the length of the slotline ports (2) and (3) may affect such characteristics as return loss and feed through of the input frequency, however it will not affect the fundamental process of subharmonic generation. No matter what the length of ports (2) and (3) energy at f/2 will always be coupled to port (6). In particular the length of ports (2) and (3) may be reduced to zero if necessary.

Figure 3A:
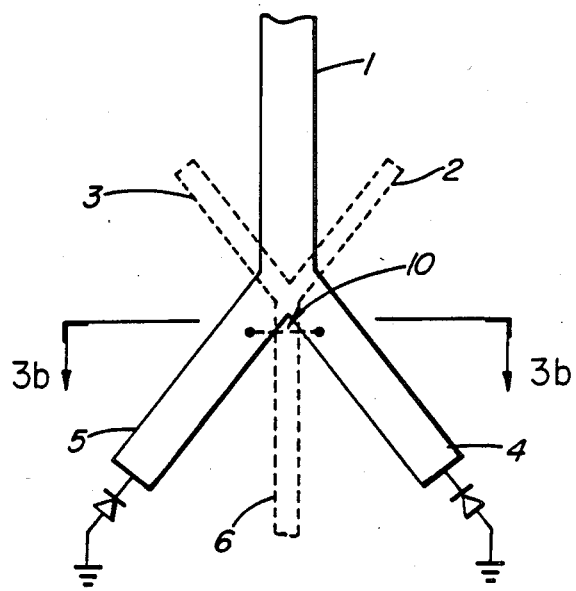

If the ports (2) and (3) are long, significant inductance is added to the subharmonic return path between the diodes (11) and (12). This restricts the frequency band over which the device will divide. To avoid this, it is necessary to provide an electrical connection (10) as in FIGS. 3(a) and (b) across port (6) to form a short electrical return path between the two diodes (11) and (12). The connection can take the form of a metal wire or a metal strap.

It will be understood by those skilled in this art that the "Y" shape of the input microstrip circuit is not critical either. FIGS. 4(a) to (d) show two microstrip configurations which are conceptionally the same. In the microstrip circuit of FIGS. 4(a) and 4(c) there is a gap (21) between two microstrip lines (22) and (23) over a dielectric substrate (29) and above a solid ground plane (24). In the circuit of FIGS. 4(b) and 4(d) there is a solid microstrip line (25) over a dielectric substrate (30) above ground planes (27) and (28) divided by a gap (26). Because the halver incorporates a slotline port (6) between ports (4) and (5) (FIGS. 2(a) and (b)), these two ports can be physically joined as shown at (25) in FIG. 4(b). This provides for further frequency halver configurations as shown in FIGS. 5(a) and (b), usig the microstrip circuits of FIGS. 4(a) to 4(d).

Still another configuration is shown in FIG. 6, which uses beam lead varactor diodes (31) and (32). This configuration obviates the requirement of drilling holes in the substrate material. In FIG. 6, the beam lead diodes (31) and (32) are attached from the microstrip lines (4) and (5) to the broadband microwave short circuits, (33) and (34). These broadband microwave short circuits have been described in Canadian Pat. No. 1,041,614 above and elsewhere. The lines (35) and (36) are high impedance lines which provide a dc return path for the diodes (31) and (32) to prevent them from accumulating charge.

This circuit operates in a manner analogous to that previously described, the only difference being the manner in which the diodes are grounded.

Typical construction of a number of circuits was fabricated on RT/Duroid 6010 with a dielectric thickness of 0.075 and others on the same material with a thickness of 0.025 inches. The frequency band of operation can be adjusted by increasing or decreasing the length of ports (4) and (5). The upper frequency limit can be calculated approximately using the following expression for the electrical length $\theta$ of ports (4) and (5):

$$\theta = \arctan\left[\frac{Y}{\pi f C}\right]$$

where Y is the admittance of each port, f is the upper input frequency and C is the junction capacitance of the diode.

The embodiments of the invention in which an exclusive property or privilege is claimed are defined as follows:

1. A microwave frequency divider comprising:
   a dielectric substrate with two parallel planar surfaces;
   a microstrip line component of conductive material on one of the planar surfaces, the microstrip line component having an input port and two other ports;
   a conductive ground plane on the other planar surface;
   two varactor diodes with respective first and second terminals, the first terminals being grounded and the second terminals being connected to respective ones of the two other ports of the microstrip line component; and
   means for extracting a signal at a frequency f/2 from the microstrip component when a signal at a frequency f is applied to the microstrip component input port, the signal extracting means comprising a slotline in the ground plane havig an output port adjacent the varactor diodes.

2. A broadband microwave frequency divider as defined in claim 1 wherein said first terminals of the varactor diodes are connected to said ground plane.

3. A microwave frequency divider as defined in claim 1, wherein the first terminals are connected to respective broadband microwave short circuits, each short circuit being connected to ground by a high impedance line.

4. A microwave frequency divider as claimed in claim 1 wherein the output port of said slotline is disposed intermediate said varactor diodes and a portion of said output port of said slotline is located in a position adjacent to a junction between the input port of said microstrip line component and the two other ports thereof.

5. A microwave frequency divider according to claim 1, wherein the slotline further comprises a pair of slotline ports symmetrically arranged with respect to and connected to the output port.

6. A broadband microwave frequency divider according to claim 5 in which an electrical connection is made across the output port.

7. A broadband microwave frequency divider according to claim 5 wherein the electrical connection made across the output port is at a junction of said pair of slotline ports.

* * * * *